(12) United States Patent
Hormis

(10) Patent No.: US 8,509,298 B2
(45) Date of Patent: *Aug. 13, 2013

(54) APPARATUS AND METHOD FOR ADAPTIVE I/Q IMBALANCE COMPENSATION

(75) Inventor: Raju Hormis, New York, NY (US)

(73) Assignee: Analog Devices, Inc., Norwood, MA (US)

( * ) Notice: Subject to any disclaimer, the term of this patent is extended or adjusted under 35 U.S.C. 154(b) by 259 days.

This patent is subject to a terminal disclaimer.

(21) Appl. No.: 12/986,093

(22) Filed: Jan. 6, 2011

(65) Prior Publication Data

US 2012/0178392 A1    Jul. 12, 2012

(51) Int. Cl.
*H03H 7/30*   (2006.01)
*H04K 3/00*   (2006.01)

(52) U.S. Cl.
USPC ............................ 375/232; 375/285; 375/350

(58) Field of Classification Search
USPC ................. 375/232, 235, 261, 279, 284, 285, 375/329, 350; 455/285, 296, 302
See application file for complete search history.

(56) References Cited

U.S. PATENT DOCUMENTS

| | | |
|---|---|---|
| 6,330,290 B1 | 12/2001 | Glas |
| 6,940,916 B1 | 9/2005 | Warner et al. |
| 7,020,220 B2 | 3/2006 | Hansen |
| 7,061,994 B2 | 6/2006 | Li et al. |
| 7,184,714 B1 | 2/2007 | Kutagulla et al. |
| 7,248,654 B2 | 7/2007 | Song et al. |
| 7,251,291 B1 | 7/2007 | Dubuc et al. |
| 7,570,923 B2 | 8/2009 | Kiss et al. |
| 7,580,683 B2 | 8/2009 | Gardenfors et al. |
| 7,609,772 B2 | 10/2009 | Yu et al. |
| 7,653,164 B2 | 1/2010 | Lin et al. |
| 7,672,655 B1 * | 3/2010 | Cousinard .................... 455/285 |
| 2002/0057752 A1 | 5/2002 | Denno |
| 2005/0227642 A1 | 10/2005 | Jensen |
| 2005/0276354 A1 | 12/2005 | Su et al. |
| 2006/0203901 A1 | 9/2006 | Tan et al. |
| 2006/0291590 A1 | 12/2006 | Elahi et al. |
| 2007/0127599 A1 | 6/2007 | Song et al. |
| 2007/0291883 A1 | 12/2007 | Welz et al. |
| 2008/0056397 A1 | 3/2008 | Li et al. |
| 2008/0080631 A1 | 4/2008 | Forenza et al. |
| 2008/0130790 A1 | 6/2008 | Forenza et al. |
| 2009/0232108 A1 | 9/2009 | Haghighat et al. |

(Continued)

OTHER PUBLICATIONS

Anttila et al., "Blind Compensation of Frequency-Selective I/Q Imbalances in Quadrature Radio Receivers: Circularity-Based Approach", 2007 IEEE International Conference on Acoustics, Speech, and Signal Processing 15-20, Apr. 15, 2007, pp. 111-245.

(Continued)

*Primary Examiner* — Lee Nguyen
(74) *Attorney, Agent, or Firm* — Knobbe, Martens, Olson & Bear LLP

(57) ABSTRACT

An I/Q imbalance compensation block of a RF receiver for compensating an imbalance between an in-phase component and a quadrature component of an RF signal is disclosed. The compensation block includes a conjugation block; an adaptive finite impulse response (FIR) filter; and an adder. The filter use filter coefficients iteratively updated at least partly in response to a compensated digital signal. The filter can have a complex number for at least one, but not all of filter taps, and real numbers for other filter taps. The filter can be provided with adaptation step sizes different from filter tap to filter tap. The filter can also be provided with an adaptation step size(s) varying over time. The filter can also be provided with an adaptation step size(s) divided by the square norm of the compensated signal.

20 Claims, 11 Drawing Sheets

(56) References Cited

U.S. PATENT DOCUMENTS

| | | |
|---|---|---|
| 2009/0315746 A1 | 12/2009 | Nitsche |
| 2010/0054367 A1 | 3/2010 | Gorday |
| 2010/0232493 A1 | 9/2010 | Thirumoorthy |
| 2012/0106686 A1 | 5/2012 | Zhang et al. |

OTHER PUBLICATIONS

International Search Report of the International Searching Authority in counterpart International Appl. No. PCT/US2011/063578, dated Jun. 14, 2012, 7 pages.

Written Opinion of the International Searching Authority in counterpart International Appl. No. PCT/US2011/063578, dated Jun. 14, 2012, 12 pages.

Anttila et al., "Circularity-Based I/Q Imbalance Compensation in Wideband Direct-Conversion Receivers," IEEE Transactions on Vehicular Technology, vol. 57, No. 4, pp. 2099-2113, Jul. 2008.

Tsai at el., "Blind Frequency-Dependent I/Q Imbalance Compensation for Direct-Conversion Receivers," IEEE Transactions on Wireless Communications, vol. 9, No. 6, pp. 1976-1986, Jun. 2010.

Notice of Allowance dated Sep. 14, 2012 in U.S. Appl. No. 12/986,069.

\* cited by examiner

● : real part
■ : imaginary part

APPARATUS AND METHOD FOR ADAPTIVE I/Q IMBALANCE COMPENSATION

CROSS-REFERENCE TO RELATED APPLICATIONS

This application is related to U.S. application Ser. No. 12/986,069, filed on Jan. 6, 2011, issued as U.S. Pat. No. 8,363,712 on Jan. 29, 2013, titled "APPARATUS AND METHOD FOR ADAPTIVE I/Q IMBALANCE COMPENSATION" (Inventor: Raju Hormis), the disclosure of which is incorporated by reference in its entirety.

BACKGROUND

1. Field

Embodiments of the invention relate to electronic devices, and more particularly, in one or more embodiments, to radio frequency receivers.

2. Description of the Related Technology

Many electronic systems operate with radio-frequency (RF) signals. Such electronic systems can include an RF receiver that processes a wireless or wired signal (for example, a radio frequency signal) received via a wireless medium, such as air, or over a wire, such as a copper cable. An RF receiver can include various components to amplify and/or filter an RF signal to recover original data carried by the RF signal.

Referring to FIG. 1, a conventional direct-conversion radio frequency (RF) receiver system will be described below. The illustrated system 100 includes an antenna 101, an input stage structure 110, an input matching network 120, a low noise amplifier (LNA) 130, a first mixer 140a, a second mixer 140b, a local oscillator 142, a phase shifter 144, a first low pass filter (LPF) 150a, a second low pass filter 150b, a first analog-to-digital converter (ADC) 160a, a second analog-to-digital converter (ADC) 160b, an adaptive I/Q compensation filter 170, an adder 180, and a baseband module 190. The adaptive I/Q compensation filter 170 and the adder 180 can be collectively referred to as an "I/Q compensation module" or "I/Q compensation block" in the context of this document. In an instance in which the receiver system is used for processing a wired signal, the antenna 101 can be omitted.

Since there are two mixers operating with 90° phase offset, the RF receiver system 100 can be referred to as using "quadrature" reception. The I/Q compensation module can be used with super-heterodyne receivers, or any other RF receiver that employs quadrature reception, even if this quadrature operation occurs in only one stage of the RF receiver.

The antenna 101 is configured to receive an RF signal. The antenna 101 can be any suitable antenna for wireless signal reception. The antenna 101 provides the received wireless signal to the input stage structure 110.

The input stage structure 110 serves to receive and process the RF signal. The input stage structure 110 can include, for example, an antenna interface circuit to interface with the antenna 101, and a filter (for example, a band pass filter) to filter out signals outside of a signal band of interest. The input stage structure 110 generates a first processed signal, which is provided as an input to the input matching network 120.

The input matching network 120 serves to improve power transfer from the input stage structure 110 to the low noise amplifier 130, and to reduce signal reflection from the low noise amplifier 130. Further, the input matching network 120 can serve to improve the noise performance of the low noise amplifier 130. The input matching network 120 is configured to match the impedance of the low noise amplifier 130 with the impedance of the structure (for example, the input stage structure 110 and the antenna 101) on the opposite side of the input matching network 120 from the low noise amplifier 130. The input matching network 120 receives the first processed signal from the input stage structure 110, and generates a second processed signal z(t), which is provided as an input to the low noise amplifier 130.

The low noise amplifier 130 serves to amplify the second processed signal z(t) from the input matching network 120 to generate an amplified signal, and provides the amplified signal to the first and second mixers 140a, 140b. The low noise amplifier 130 is configured to amplify a relatively weak signal with a gain such that the effect of noise on subsequent stages of the receiver system 100 is reduced.

The first mixer 140a serves to mix the amplified signal from the low noise amplifier 130 and a first local frequency signal LOI from the phase shifter 144 to generate a first mixed signal. The first mixed signal can include the fundamental frequencies of the current signal, the first local frequency signal, harmonics thereof, and intermodulation products. The second mixer 140b serves to mix the amplified signal from the low noise amplifier 130 and a second local frequency signal LOQ from the phase shifter 144 to generate a second mixed signal. The second mixed signal can include the fundamental frequencies of the current signal, the second local frequency signal, harmonics thereof, and intermodulation products.

In the illustrated example, the first local frequency signal LOT can be used to process in-phase (I) components of the received signal while the second local frequency signal LOQ can be used to process quadrature (Q) components of the received signal. Ideally, the first and second local frequency signals LOI, LOQ should have a phase difference of 90 degrees from each other. The phase shifter 144 is configured to generate such a phase difference, using a local oscillation signal from the local oscillator 142. These components can also exist in other types of RF receivers, such as super-heterodyne or low-IF receivers.

The first and second low pass filters 150a, 150b serve to filter the first and second mixed signals, respectively, and provide the filtered mixed signals to the first and second analog-to-digital converters 160a, 160b, respectively. The first and second low pass filters 150a, 150b are for anti-aliasing, and pass frequencies up to some cut-off frequency. These filters block higher frequencies beyond this cut-off frequency.

The first and second analog-to-digital converters 160a, 160b serve to convert the filtered mixed signals from analog form into a digital signal x[n]. The first mixer 140a, the first LPF 150a, and the first ADC 160a form an in-phase or I path. The second mixer 140b, the second LPF 150b, and the second ADC 160b form a quadrature-phase or Q path. The first and second analog-to-digital converters 160a, 160b can provide the digital signal x[n] as an input to the adaptive filter 170 and the adder 180. The output of the first ADC 160a forms the real number portion of the digital signal x[n], and the output of the second ADC 160b forms the imaginary number portion of the digital signal x[n].

The adaptive filter 170 is configured to generate a compensation signal to compensate for an imbalance between the I path and the Q path. Such an imbalance can be referred to as "I/Q imbalance" or "I/Q mismatch" in the context of this document, and will be described later in detail. The adaptive filter 170 can use a feedback signal from the adder 180, and the digital signal x[n] to generate the compensation signal that is to be provided to the adder 180.

The adder 180 is configured to add the digital signal x[n] and the compensation signal, and provides the compensated signal to the baseband module 190. The baseband module 190 receives the compensated signal from the adder 180, and performs digital signal processing on the signal. The digital signal processing can include, for example, demultiplexing and decoding.

In an RF receiver such as a direct-conversion receiver, I/Q imbalance occurs, for example, when the transfer function of the I path of the receiver is different from that of the Q path of the receiver, and/or when the phase relationship between the two paths is not quite 90 degrees. Such imbalance occurs due to imperfections and variability of the analog components of an RF receiver, such as the filters, mixers, amplifiers, and ADCs. Sources of such imbalances include, but are not limited to, gain and phase mismatch of the mixers, frequency responses of low pass filters, gain and offset of ADCs, ADC-clock timing mismatch; and a non-linear I/Q imbalance. I/Q imbalance is typically unavoidable using state-of-art analog circuit implementations.

I/Q imbalance can adversely affect the performance of an RF receiver. For example, I/Q imbalance can decrease the image rejection ratio (IRR) of an RF receiver down to, for example, 20-40 dB, resulting in crosstalk or interference between mirror frequencies. Thus, I/Q imbalance reduces the signal-to-noise ratio of the receiver 100, and increase the number of bit errors for a given data rate. Thus, I/Q imbalance needs to be reduced or cancelled.

I/Q imbalance can produce an undesired image signal, which falls within the band of interest. The term "image signal" refers to an undesired signal at frequencies occupied by the desired input signal. I/Q imbalance is a potential source of interference to proper reception. The term "image rejection ratio" is a measure of image strength relative to desired signal, and can refer to a ratio of (a) power of the desired signal to (b) power of the image signal. The image rejection ratio is usually expressed in decibels (dB). A desired IRR performance can be at least 45 dB, for example, in cable-modem applications where the desired baseband signal occupies 50-70 MHz of bandwidth.

There have been various attempts to reduce or eliminate I/Q balance from RF receivers. Among others, digital signal processing techniques have been used to reduce I/Q imbalance. Some of these techniques focus on frequency-independent I/Q imbalance compensation in specific architectures and assume certain modulation schemes possibly combined with some known pilot or training data. Other techniques attempt to compensate for frequency-dependant imbalances, assuming known pilot data or using interference cancellation (IC) or blind signal separation (BSS) principles.

Among the techniques for frequency-dependent I/Q imbalance compensation, Anttila et al., "Circularity-Based I/Q Imbalance Compensation in Wideband Direct-Conversion Receivers," IEEE Transactions on Vehicular Technology, Vol. 57, No. 4, pp. 2099-2113 (July 2008), presents a blind (non-data-aided) circularity-based compensation of frequency-dependent I/Q imbalances in RF receivers.

Referring to FIG. 2A, an I/Q compensation module disclosed by Anttila et al. will be described below. The illustrated I/Q compensation module 200 includes a first node 201, a second node 202, a complex conjugation block 210, an adaptive filter 220, a delay element 225, a filter adaptation block 227, and an adder 230. A digital signal x[n] is provided to the first node 201 from the I and Q paths of a receiver, such as the I and Q paths of FIG. 1. The digital signal x[n] is provided to the adder 230 and the conjugation block 210.

In the context of this document, "n" denotes a discrete-time index, where the time-interval between indices can be found from the sampling rate. In the context of this document, a discrete-time sequence of samples "x" is referred to as "x[n]." For simplicity of notation, "x[n]" can also be used to indicate the value of the sequence "x" at time-index "n." Vectors in boldface, such as $x_n$, will be used to refer to the vector at time-index "n."

The conjugation block 210 is configured to change the polarity of the imaginary number part of the digital signal x[n], thereby generating a complex conjugate signal x*[n] of the digital signal x[n]. For example, the digital signal x[n] can be a sequence of complex numbers. For example, let one sample in the sequence be expressed as a+jb, in which a is the real number part, jb is the imaginary number part, and j corresponds to the square root of −1. The complex conjugate x*[n] has the same real part and has an imaginary part having the same magnitude and the opposite sign. In the example above, the complex conjugate can be expressed as a−jb.

The adaptive filter 220 can be a finite impulse response (FIR) filter, whose coefficients at time-index "n" can be expressed as the vector $w_n$. The FIR filter is a type of a discrete-time filter. The FIR filter can generate an output digital sequence v[n] as expressed in Equation 1 below.

$$v[n]=w_n[0]x[n-N+1]+w_n[1]x[n-N]+\ldots+w_n[i]x[n-N+i]+\ldots+w_n[N-1]x[n] \quad \text{Equation 1}$$

In Equation 1, variable x[n] is the input signal, and variable v[n] is the output signal. Weights $w_n[i]$, (i=0, 1, 2, ..., N−1) are filter coefficients at time "n," also known as tap weights. N is the filter order or length, and an (N+1)th order filter has N terms, each of which can be referred to as a tap. For example, weight $w_n[0]$ can be referred to as a first tap at time "n," which can correspond to a tap that is not delayed. Weight $w_n[1]$ can be referred to as a second tap. $w_n[N-1]$ can be referred to as an N-th tap.

The adaptation filter 220 receives a feedback signal $\lambda y_n$ y[n] from the adder 230 via the delay element 225 and the filter adaptation block 227. In the illustrated example, an output signal y[n] from the adder 230 is delayed by the delay element 225. The amount of a delay provided by the delay element 225 can be at least one sample. The delayed output signal is provided to the filter adaptation block 227, which generates the feedback signal $\lambda y_n$ y[n]. The feedback signal $\lambda y_n$ y[n] is used by the adaptive filter 220 to generate a compensation signal to be added to the input signal x[n] at the adder 230 to cancel or reduce I/Q imbalance.

The adaptive filter 220 is configured to perform a complex-convolution operation (*) on the conjugate signal x*[n] with the adaptive filter signal $w_n$ to generate a compensation signal expressed as $x^*[n]^*w_n$. The convolution operation can be computed as the sum of the product of the two sequences after one is reversed and shifted on the time axis. The adaptive filter $w_n$ can be iteratively updated as in Equation 2 below.

$$w_{n+1}w_n-\lambda y_n y[n] \quad \text{Equation 2}$$

In Equation 2, y[n] is the compensated signal value at time "n." This value can be expressed as $y[n]=x[n]+v[n]=w_n^T x_n$, wherein $w_n \underline{\Delta} [w_n[0], w_n[1], w_n[2], \ldots, w_n[N-1]]^T$ denotes the vector of coefficients (alternatively "filter coefficients") of the compensator at time index n, and the vector $x_n \underline{\Delta} [x[n-N+1], x[n-N], \ldots, x[n]]^T$. λ denotes the adaptation step size or adaptation rate, and $y_n \underline{\Delta} [y[n], y[n-1], \ldots, y[n-N+1]]^T$.

The adder 230 adds the compensation signal to the digital signal x[n], and provides the compensated signal y[n] to the baseband module 190 (FIG. 1) of the receiver. The compensated signal sequence y[n] is provided as a feedback signal to the adaptive filter 220 through the delay element 225 and the filter adaptation block 227.

The technique described in the above example is blind to the received baseband signal, which is useful since a training signal need not be applied at the receiver input. The technique is adaptive in that it accounts for time-varying mismatches. The technique is also frequency-selective, and thus can be suitable for correction of wideband channels.

Equation 2, above, indicates that the technique determining filter coefficients $w_n$ blindly (i.e., without knowledge of the baseband signal) and adaptively by employing the signal "properness" property, that is, determining if y[n] is a proper signal sequence, which indicates that y[n] and y*[n] are uncorrelated. In the technique of Anttila et al., $\lambda$ is a fixed training coefficient selected by the user. After convergence, the signal y[n] should exhibit the condition expressed in Equation 3 below, in which E denotes expected value operator (or expectation operator) that provides the long-run average.

$$E[y[n-i],y[n]]=0, \text{ where } i=0, 1, \ldots N-1. \qquad \text{Equation 3}$$

SUMMARY

In one embodiment, an apparatus includes a finite impulse response (FIR) filter configured to filter a version of a digital signal to generate a compensation signal, wherein the FIR filter has filter coefficients, wherein the digital signal comprises a digital representation of a demodulated in-phase and quadrature phase component of a radio frequency (RF) signal. The apparatus also includes an adder configured to sum another version of the digital signal and a version of the compensation signal to generate a balanced digital signal that has an improved image rejection ratio versus the digital signal; and an adaptation step size adaptor for providing two or more different adaptation step sizes for updating the filter coefficients. One of the versions of the digital signal or the version of the compensation signal is a complex conjugate of the digital signal or a complex conjugate of the compensation signal, respectively, and the others are not the complex conjugates, wherein the FIR filter and the adder comprise electronic hardware.

In another embodiment, an apparatus includes a finite impulse response (FIR) filter configured to filter a version of a digital signal to generate a compensation signal, wherein the FIR filter has filter coefficients, wherein the digital signal comprises a digital representation of a demodulated in-phase and quadrature phase component of a radio frequency (RF) signal. The apparatus further includes an adder configured to sum another version of the digital signal and a version of the compensation signal to generate a balanced digital signal that has an improved image rejection ratio versus the digital signal; and an adaptation step size adaptor for providing adaptation step sizes for updating the filter coefficients, wherein the adaptation step size adaptor is configured to vary adaptation step sizes for one or more of the filter coefficients over time. One of the versions of the digital signal or the version of the compensation signal is a complex conjugate of the digital signal or a complex conjugate of the compensation signal, respectively, and the others are not the complex conjugates, wherein the FIR filter and the adder comprise electronic hardware.

In yet another embodiment, an apparatus includes a finite impulse response (FIR) filter configured to filter a version of a digital signal to generate a compensation signal, wherein the FIR filter has filter coefficients, wherein the digital signal comprises a digital representation of a demodulated in-phase and quadrature phase component of a radio frequency (RF) signal. The apparatus also includes an adder configured to sum another version of the digital signal and a version of the compensation signal to generate a balanced digital signal that has an improved image rejection ratio versus the digital signal; and an adaptation step size adaptor for providing adaptation step sizes for updating the filter coefficients, wherein the adaptation step size adaptor is configured to divide adaptation step sizes for one or more of the filter coefficients by the square noun of the balanced digital signal. One of the versions of the digital signal or the version of the compensation signal is a complex conjugate of the digital signal or a complex conjugate of the compensation signal, respectively, and the others are not the complex conjugates, wherein the FIR filter and the adder comprise electronic hardware.

In yet another embodiment, a method of improving an image rejection ratio of a digital signal having demodulated in-phase and quadrature-phase components of a radio frequency signal is provided. The method includes filtering a version of the digital signal with a finite impulse response (FIR) filter having filter coefficients to generate a compensation signal, wherein filtering is implemented by hardware or by instructions implemented by a processor; generating a complex conjugate of the digital signal or the compensation signal; and summing another version of the digital signal and a version of the compensation signal to generate a balanced digital signal that has an improved image rejection ratio versus the digital signal, wherein one of the versions of the digital signal and the version of the compensation signal corresponds to a complex conjugate of the digital signal or the compensation signal, respectively, and the others are not the complex conjugates. The method also includes generating a feedback signal by multiplying the correlation of the balanced digital signal with two or more different adaptation step sizes for the filter coefficients; and determining the filter coefficients, using the feedback signal.

In yet another embodiment, a method of improving an image rejection ratio of a digital signal having demodulated in-phase and quadrature-phase components of a radio frequency signal is provided. The method includes filtering a version of the digital signal with a finite impulse response (FIR) filter having filter coefficients to generate a compensation signal, wherein filtering is implemented by hardware or by instructions implemented by a processor; generating a complex conjugate of the digital signal or the compensation signal; and summing another version of the digital signal and a version of the compensation signal to generate a balanced digital signal that has an improved image rejection ratio versus the digital signal, wherein one of the versions of the digital signal and the version of the compensation signal corresponds to a complex conjugate of the digital signal or the compensation signal, respectively, and the others are not the complex conjugates. The method also includes generating a feedback signal by multiplying the correlation of the balanced digital signal with one or more adaptation step sizes for the filter coefficients, wherein at least one of the adaptation step sizes is varied over time; and determining the filter coefficients, using the feedback signal.

In yet another embodiment, a method of improving an image rejection ratio of a digital signal having demodulated in-phase and quadrature-phase components of a radio frequency signal is provided. The method includes: filtering a version of the digital signal with a finite impulse response (FIR) filter having filter coefficients to generate a compensation signal, wherein filtering is implemented by hardware or by instructions implemented by a processor; generating a complex conjugate of the digital signal or the compensation signal; and summing another version of the digital signal and a version of the compensation signal to generate a balanced digital signal that has an improved image rejection ratio versus the digital signal, wherein one of the versions of the digital signal and the version of the compensation signal corresponds to a complex conjugate of the digital signal or the compensation signal, respectively, and the others are not the complex conjugates. The method also includes generating a feedback signal by multiplying the correlation of the balanced digital signal with one or more adaptation step sizes for the filter coefficients, wherein the one or more of the adaptation step sizes is divided by the square norm of the balanced digital signal; and determining the filter coefficients, using the feedback signal.

DETAILED DESCRIPTION OF EMBODIMENTS

Figure 1:
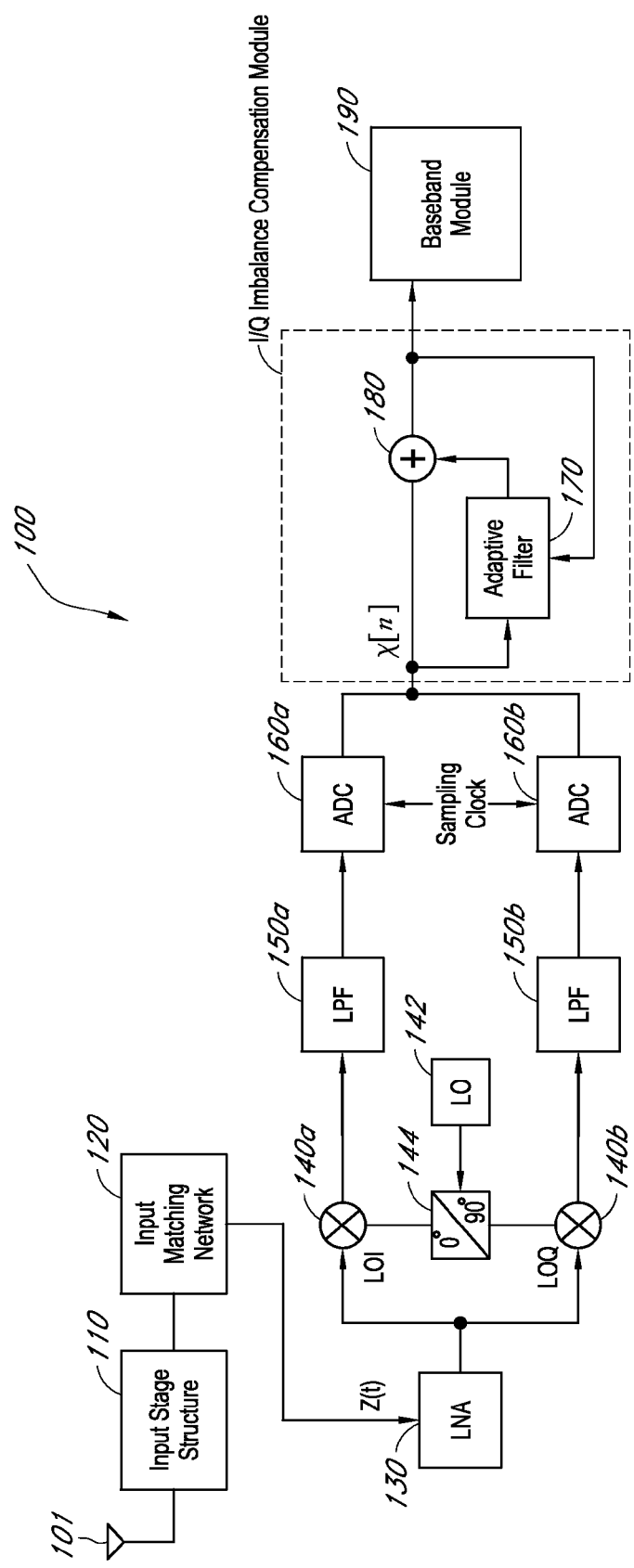
FIG. 1 is a schematic block diagram illustrating a conventional radio frequency (RF) receiver.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Improved Adaptive Filter by Model Reduction Technique

In connection with the above-described technique of Anttila et al., the instantaneous product y[n] y[n] is an estimate of correlation strength, and thus an estimate of strength of image y*[n] present in y[n]. The technique iteratively adapts the coefficient to drive the image signal to 0. Since these iterations cannot take place instantaneously, there is an adaptation period that is called "convergence time."

Anttila, et al., obtained about 40-55 dB of imbalance rejection on a 10 MHz receiver. However, Applicant recognized that, for wideband receivers (for example, on RF receivers with 50-100 MHz of bandwidth) with severe I/Q imbalance, the technique is not only slow to converge, but also does not exhibit a minimum desired image rejection ratio (for example, at least about 45 dB) even after convergence. Further, the Anttila's technique is computationally expensive.

In one embodiment, the compensation filter is modeled as closely as possible to the impulse response of the I/Q imbalance. Although the imbalance typically cannot be known or assumed before experiencing the actual imbalance in the receiver, Applicant recognized that there are certain general patterns. When the analog low-pass filters have all pole designs (for example, Butterworth filters or Chebyshev filters), the imaginary part of the I/Q imbalance is typically negligibly small in relation to the real parts of the response. Typically, the only exception is at the first tap (n=0), in which the imaginary part of the response is relatively significant.

Figure 2A:
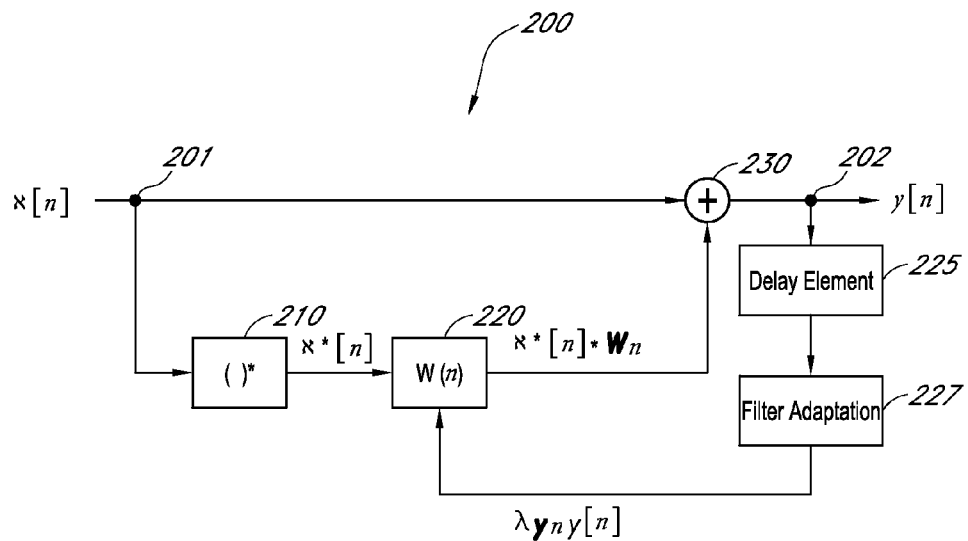
FIG. 2A is a schematic block diagram illustrating a conventional I/Q imbalance compensation module.
Figure 2B:
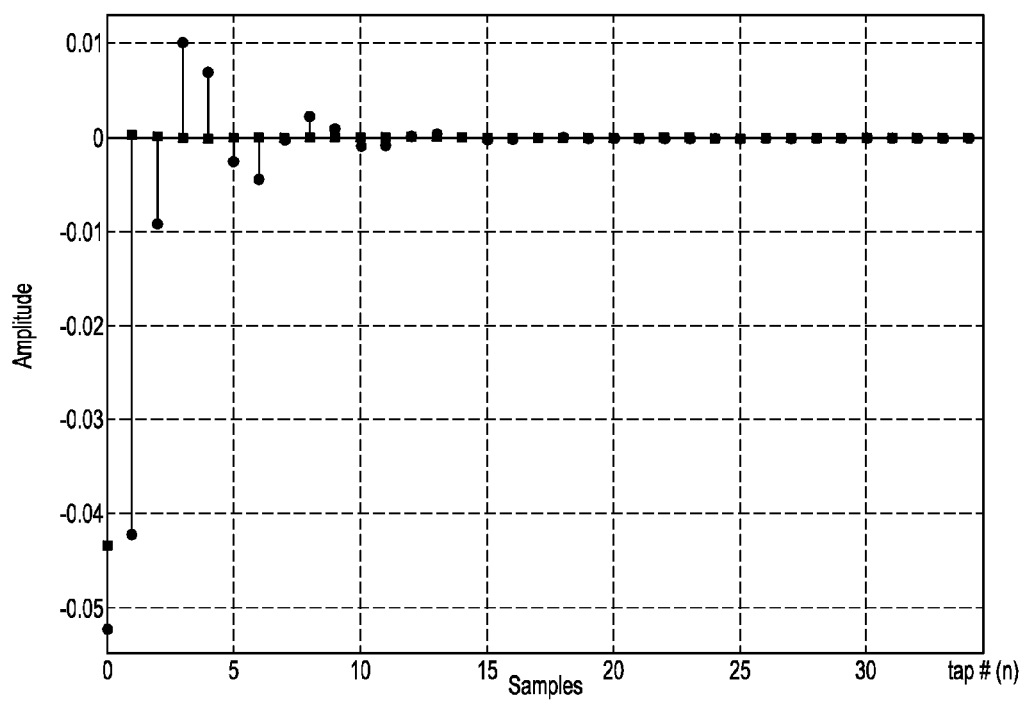
FIG. 2B is a graph of impulse responses of I/Q imbalance obtained from the adaptive filter of FIG. 2A.

An example of such a pattern is shown in FIG. 2B, which illustrates examples of filter coefficients. In FIG. 2B, at a first tap (n=0), the complex number is about −0.053−j0.044, that is, the real part of the complex number is about −0.053, and the imaginary part of the complex number is −0.044. At n=1, the complex number is about −0.042+j0. At n=2, the complex number is about −0.009+j0. At n=3, the complex number is about 0.01+j0. At n=4, the complex number is about 0.007+j0. At n=5, the complex number is about −0.003+j0. At n=6, the complex number is about −0.005+j0. At n=7, the complex number is about −0.001+j0. At n=8, the complex number is about 0.003+j0. At n=9, the complex number is about 0.001+j0. At n=10, the complex number is about −0.001+j0. The complex number converges to 0+j0 roughly at n=16. A skilled artisan will appreciate that actual values of taps can vary widely from chip to chip while having the above-described general pattern.

In recognition of the above pattern, in one embodiment, a finite impulse response adaptive filter in which only the first tap of the filter is a complex number, and the other taps of the filter are purely real numbers is disclosed. In general, an $N^{th}$ order filter according to one embodiment of the invention has N+1 taps and N+1 real number coefficients, and fewer than N+1 imaginary number coefficients. Alternatively, a FIR filter having more real number coefficients than imaginary number coefficients is used. For example, only the first tap and a few immediately next taps of the filter are complex numbers, and the other taps of the filter are purely real numbers. Advantageously, these configurations speed up convergence in addition to reducing the complexity of the filter. In the context of this document, these configurations can be referred to as "model reduction techniques."

Figure 3:
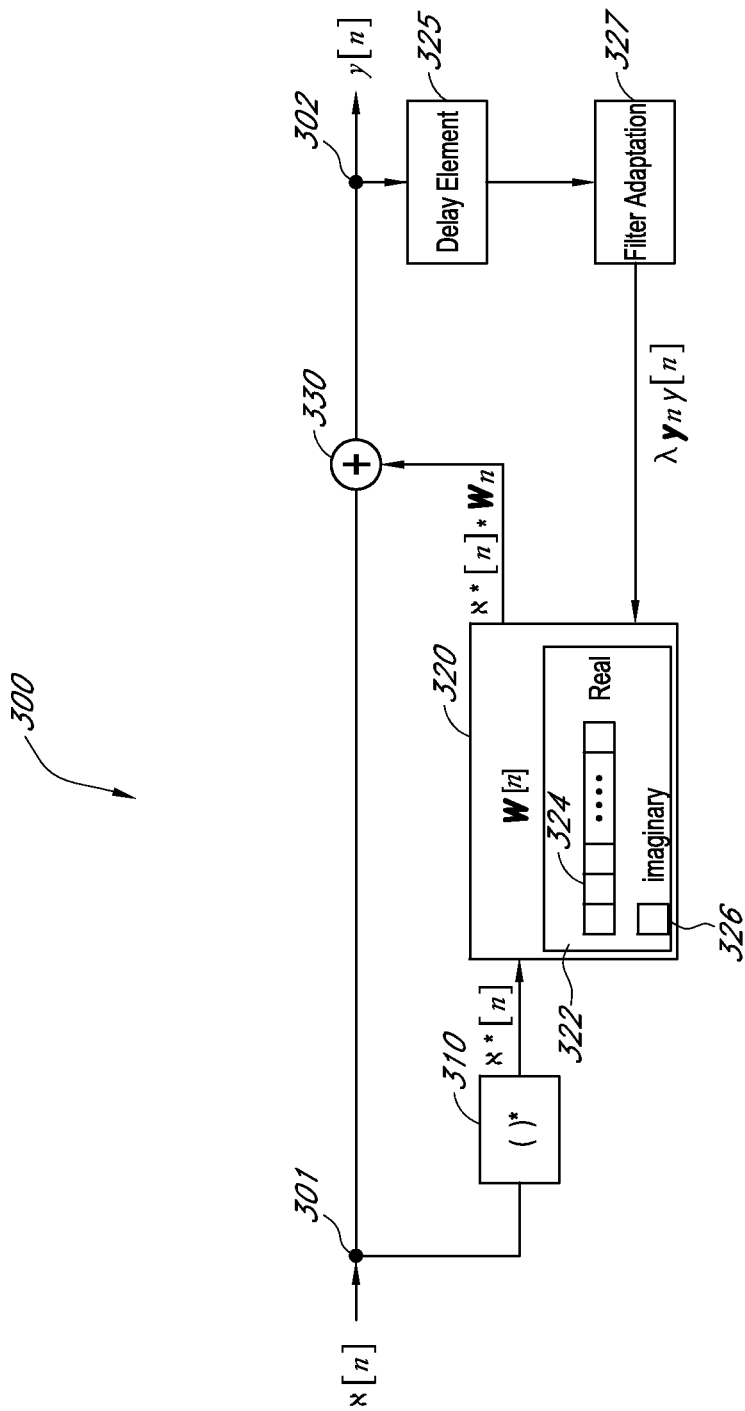
FIG. 3 is a schematic block diagram illustrating an I/Q imbalance compensation module according to one embodiment.

Referring to FIG. 3, an I/Q imbalance compensation module according to one embodiment will be described below. The illustrated I/Q imbalance compensation module 300 includes a first node 301, a second node 302, a complex conjugation block 310, an adaptive filter 320, a delay element 325, a filter adaptation block 327, and an adder 330. In one embodiment, each of the conjugation block 310, the adaptive filter 320, the delay element 325, the filter adaptation block 327, and the adder 330 can be implemented in firmware or hardware. The conjugation block 310, the adaptive filter 320, and the adder 330 can operate real time. The delay element 325 and the filter adaptation block 327 can operate real time. However, the filter adaptation block 327 can have some latency, i.e., it may take a few sampling clock intervals to compute the first output sample. However, every sample it outputs after the first sample can be at a sample clock interval.

A complex digital signal x[n] is provided to the first node 301 from the and Q paths of a receiver, such as the I and Q paths of FIG. 1. The digital signal x[n] is provided to the adder 330 and the conjugation block 310. Other details of the first node 301, the second node 302, the conjugation block 310, the delay element 325, the filter adaptation block 327, and the adder 330 can be as described above in connection with the first node 201, the second node 202, the conjugation block 210, the delay element 225, the filter adaptation block 227, and the adder 230, respectively, of FIG. 2A. In an alternative embodiment, the order of operation for the complex conjugation block 310 and the adaptive filter 320 are interchanged, as will be described in connection with FIG. 8.

In the illustrated embodiment, the adaptive filter 320 can be a finite impulse response (FIR) filter that serves to perform a convolution operation (*) on the conjugate signal x*[n] with the filter coefficients $w_n$ to generate a compensation signal expressed in $x^*[n]*w_n$. While the above Equation 1 applies to the adaptive filter 320 of FIG. 3, the adaptive signal $w_n$ can be iteratively updated for each tap, as in Equation 4 below.

$$w_{n+1}[i] = w_n[i] - \lambda y[n]y[n-i] \text{ for } i=0, 1, 2, \ldots, N-1 \quad \text{Equation 4}$$

In Equation 4, i is the tap number of the finite impulse response adaptive filter 320. Equation 4 indicates that the filter coefficient of a tap is updated by subtracting a feedback value $\lambda y[n] y[n-i]$ from the filter coefficient of the tap at an immediately previous sampling time. The feedback value is generated from the output signal y[n] through the delay element 325 and the filter adaptation block 327. $\lambda$ is a fixed training coefficient selected, through trial and error, by the user. The value of $\lambda$ can vary widely, depending on the RF front-ends having different noise and/or I/Q imbalance.

Equation 2 can be expressed for each tap, as in Equations 4-1 to 4-N below. The filter coefficient is applied to the conjugate value of the input signal x[n] by a convolution operation to generate a value to be added to the input signal x[n] to reduce or remove values contributing to I/Q imbalance.

$$\text{Tap } 0: w_{n+1}[0] = w_n[0] - \lambda y[n]y[n-0] \quad \text{Equation 4-1}$$

$$\text{Tap } 1: w_{n+1}[1] = w_n[1] - \lambda y[n]y[n-1] \quad \text{Equation 4-2}$$

$$\text{Tap } 2: w_{n+1}[2] = w_n[2] - \lambda y[n]y[n-2] \quad \text{Equation 4-3}$$

$$\vdots \qquad \vdots$$

$$\text{Tap } N-1: w_{n+1}[N-1] = w_n[N-1] - \lambda y[n]y[n-N+1] \quad \text{Equation 4-N}$$

In iteratively calculating Equation 4, only coefficient $w_n[0]$ is a complex number, and coefficients for the other taps, such as coefficients $w_n[1], w_n[2], w_n[3], \ldots, w_n[N-1]$ are assumed to be purely real numbers, ignoring their imaginary parts. Thus, in the Equations 4-1 to 4-N above, coefficient $w_n[0]$ for the Tap 0 is a complex number having both the real and imaginary parts. However, coefficients $w_n[1], w_n[2], \ldots, w_n[N-1]$ for the Taps 1 to (N-1) are real numbers having no imaginary part. Thus, $w_n$, which is used in the convolution operation of $x^*[n]*w_n$, can be expressed as in Equation 5-1 below.

$$w_n = \begin{pmatrix} w_n[0] \\ w_n[1] \\ \vdots \\ w_n[N-1] \end{pmatrix} = \begin{pmatrix} c_0 + jd_0 \\ c_1 \\ \vdots \\ c_{N-1} \end{pmatrix} = \begin{pmatrix} c_0 \\ c_1 \\ \vdots \\ c_{N-1} \end{pmatrix} + j \begin{pmatrix} d_0 \\ 0 \\ \vdots \\ 0 \end{pmatrix} \quad \text{Equation 5-1}$$

When the coefficients $w_n[0], w_n[2], w_n[3], \ldots, w_n[N-1]$ are used by the adaptive filter 320, an output from the adaptive filter 320 can be expressed as in Equation 5-2 below.

$$v[n] = w_n[0]x[n-N+1] + w_n[1]x[n-N] + \ldots + \quad \text{Equation 5-2}$$
$$w_n[i]x[n-N+i] + \ldots + w_n[N-1]x[n]$$
$$= (c_0 + jd_0)x[n-N+1] + c_1x[n-N] + \ldots +$$
$$c_i x[n-N+i] + \ldots + c_{N-1}[N-1]x[n]$$

As coefficient $w_n$ has only a complex number for the first tap, the computational complexity of adaptation can be significantly reduced, compared to the technique of Anttila et al., thereby reducing the convergence time. In other embodiments, the reduction in complexity of computation of the adaptive coefficient determination can also be used in an FIR filter having, for example, an equal number of real number coefficients and imaginary number coefficients by setting some of the imaginary number coefficients to zero.

In the illustrated embodiment, the adaptive filter 320 can include storage 322 having multiple cells 324 for a plurality of real parts for the tap coefficients, but only a single cell 326 for an imaginary part of the first tap ($w_n[0]$). In one embodiment, the storage 322 can include one or more registers. In another embodiment, the storage 322 can be any suitable type of volatile or non-volatile memory devices.

Variable Adaptation Step Size for Adaptive Filter

In another embodiment, the adaptive filter of FIG. 2A can be provided with different adaptation step sizes for different taps. In yet another embodiment, the adaptive filter of FIG. 2A can be provided with a single variable adaptation step size that can vary over time. In yet another embodiment, the adaptive filter of FIG. 2A can be provided with different adaptation step sizes for different taps that vary over time. Each of these embodiments can be combined with the embodiment of FIG. 3 with model reduction technique.

Figure 4A:
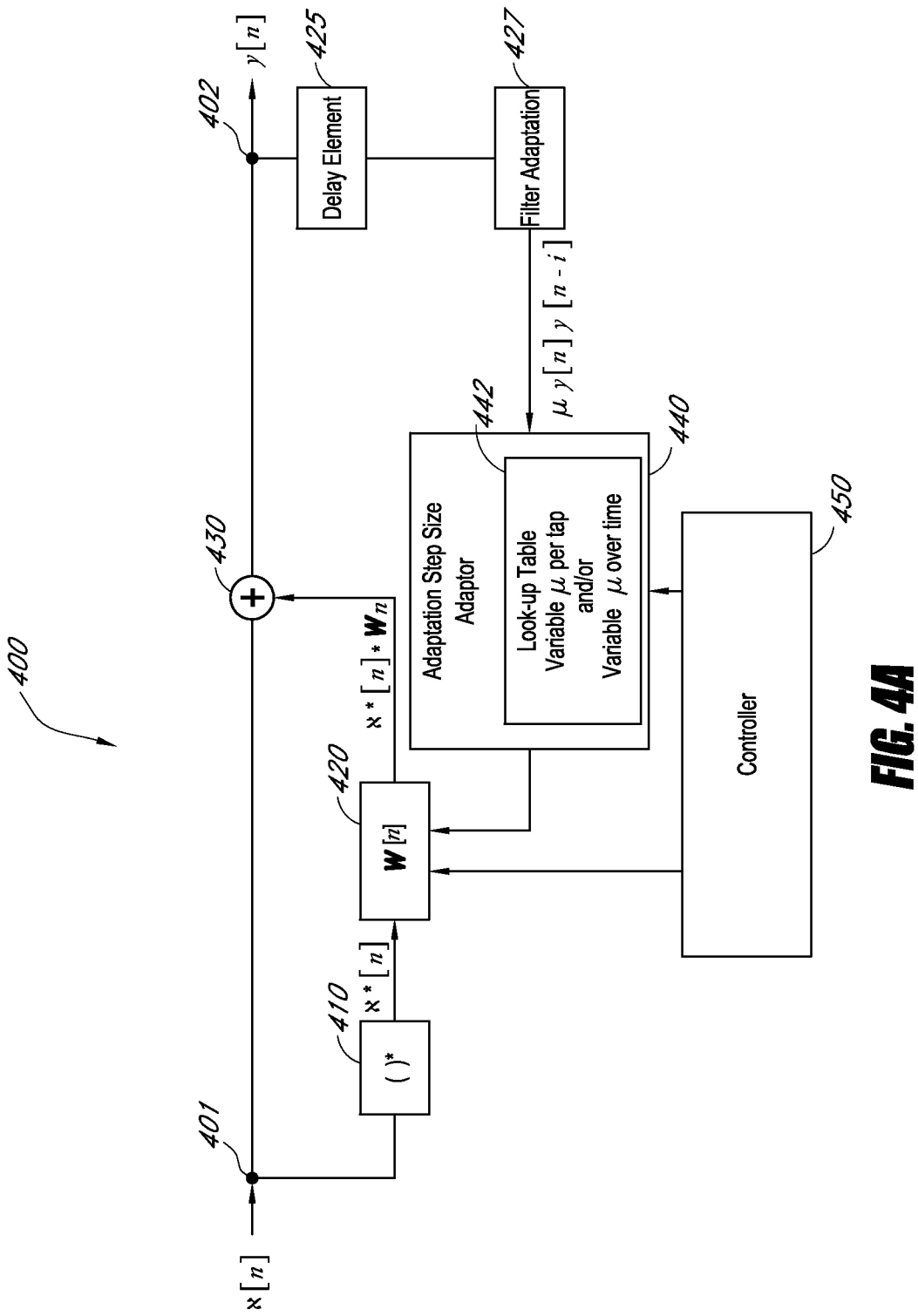
FIG. 4A is a schematic block diagram illustrating an I/Q imbalance compensation module according to another embodiment.
Figure 4B:
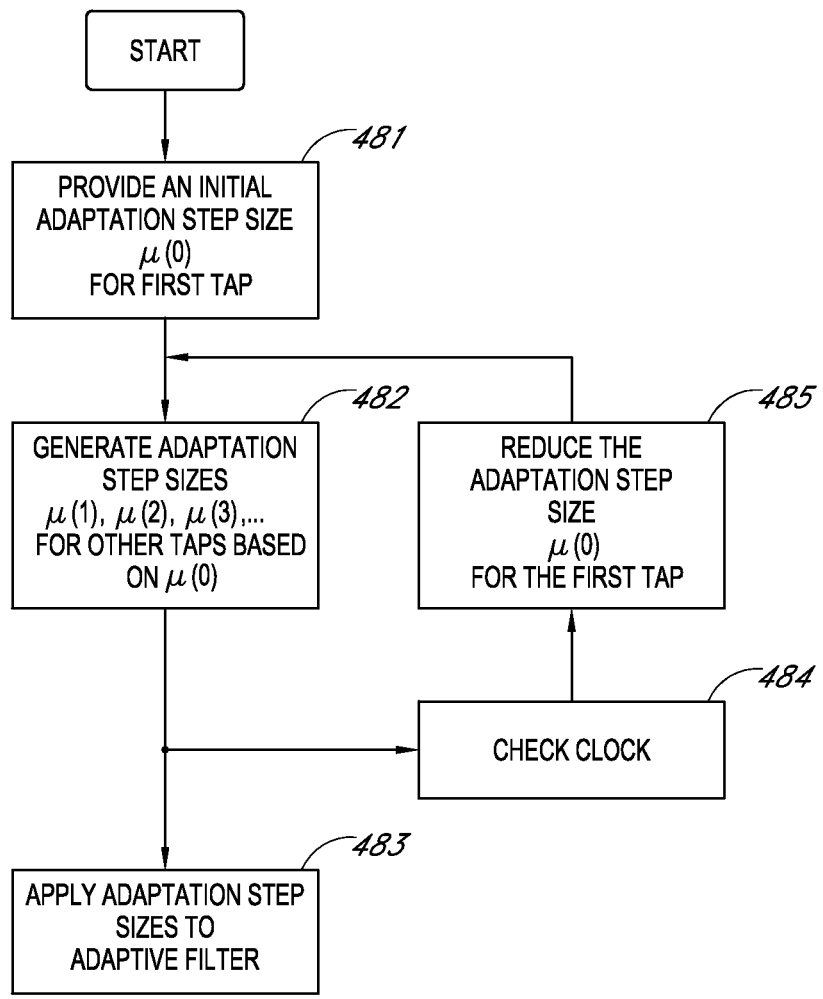
FIG. 4B is a flowchart illustrating a method of generating variable adaptation step sizes according to one embodiment.

Referring to FIG. 4, an I/Q imbalance compensation module with an adaptive filter having variable adaptation step sizes according to another embodiment will be described below. The illustrated I/Q imbalance compensation module 400 includes a first node 401, a second node 402, a complex conjugation block 410, an adaptive filter 420, a delay element 425, a filter adaptation block 427, an adder 430, an adaptation step size adaptor 440, and a controller 450. A digital signal x[n] is provided to the first node 401 from the I and Q paths of a receiver, such as the I and Q paths of FIG. 1. The digital signal x[n] is provided to the adder 430 and the conjugation block 410. Other details of the first node 401, the second node 402, the conjugation block 410, the delay element 425, the filter adaptation block 427, and the adder 430 can be as described above in connection with the first node 201, the second node 202, the conjugation block 210, the delay element 225, the filter adaptation block 227, and the adder 230, respectively, of FIG. 2A.

The adaptive filter 420 can be a finite impulse response (FIR) filter that serves to perform a convolution operation (*) on the conjugate signal x[n] with FIR coefficients $w_n$ to generate a compensation signal expressed in x*[n]*$w_n$. In one embodiment, the configuration of the adaptive filter 420 can be the same as that of the adaptive filter 220 of FIG. 2A except that the adaptation step size λ is replaced with variable step size μ, which will be described below. In another embodiment, the configuration of the adaptive filter 420 can be the same as that of the adaptive filter 320 of FIG. 3 except that the adaptation step size λ is replaced with the variable step size μ.

Applicant recognized that the impulse response of the I/Q imbalance of the receiver exhibits an overall exponential decay. In one embodiment, the adaptive filter can be designed with dedicated adaptation step size μ for each tap. For example, μ(i) can be designated as μ for an i-th tap. The adaptive filter $w_n$ can be iteratively updated as expressed in Equation 6 below.

$$w_{n+1}(i) = w_n(i) - \mu(i) y[n] y[n-i]$$ Equation 6

When "i" refers to a tap that is purely real (i.e., not a complex number), although y[n] y[n-i] represents a multiplication of 2 complex numbers, only the real part of the product y[n] y[n-i] is used in updating the filter coefficient. The imaginary part of y[n] y[n-i] need not be computed. This also reduces the computational complexity of the system.

In one embodiment, the adaptive filter 420 can have different μ per tap as in Equation 7 below.

$$\mu(i) = \mu(0)/2^i$$ Equation 7

In Equation 7, μ(i) is the adaptation step size of the i-th filter coefficient, and μ(0) is the first filter coefficient. The adaptation step sizes can be expressed in Equations 7-1 to 7-N below.

$$\mu(1) = \mu(0)/2$$ Equation 7-1

$$\mu(2) = \mu(1)/2 = \mu(0)/4$$ Equation 7-2

$$\mu(3) = \mu(2)/2 = \mu(0)/8$$ Equation 7-3

$$\vdots \qquad \vdots$$

$$\mu(N-1) = \mu(N-2)/2 = \mu(0)/2^{N-1}$$ Equation 7-N

Thus, the adaptive filter 420 can be updated in accordance with Equations 8-1 to 8-N as applicable.

Tap 0: $w_{n+1}[0] = w_n[0] - \mu(0) y[n] y[n-0]$ Equation 8-1

Tap 1: $w_{n+1}[1] = w_n[1] - \mu(1) y[n] y[n-1]$ Equation 8-2

Tap 2: $w_{n+1}[2] = w_n[2] - \mu(2) y[n] y[n-2]$ Equation 8-3

$$\vdots \qquad \vdots$$

Tap n: $w_{n+1}[N-1] = w_n[N-1] - \mu(N-1) y[n] y[n-N+1]$ Equation 8-N

In another embodiment, μ's for the taps can be different from one another, while being different from those in Equations 7-1 to 7-N. A skilled artisan will appreciate that step sizes μ for taps can be adapted for a particular receiver.

The adaptation step size adaptor 440 serves to provide different adaptation step sizes μ for the different taps of the adaptive filter 430. In one embodiment, the adaptation step size adaptor 440 can include a look-up table 442 to store different values of the step size μ for each tap, and can provide the values for components of the feedback signal y[n−N+i], i=0, 1 . . . , N−1 in Equations 8-1 to 8-N above. In the illustrated embodiment, the adaptation step size adaptor 440 is depicted as being separate from the adaptive filter 420. In an alternative embodiment, the adaptation step size adaptor 440 is integrated with the adaptive filter 420.

The controller 450 serves to control the adaptive filter 420 and the adaptation step size adaptor 440 to perform the operations described above. In one embodiment, the adaptive filter 420 and the adaptation step size adaptor 440 can be implemented by a digital circuit. In another embodiment, each of the conjugation block 410, the adaptive filter 420, the delay element 425, the filter adaptation block 427, the adaptation step size adaptor 440, and the adder 430 can be implemented in firmware or hardware. The conjugation block 410, the adaptive filter 420, and the adder 430 can operate real time. The delay element 425, the filter adaptation block 427, and the adaptation step size adaptor 440 can operate non-real time.

In the illustrated embodiment, the controller 450 is depicted as being separate from the adaptive filter 420 or the adaptation step size adaptor 440. In an alternative embodiment, the controller 450 can be integrated with the adaptive filter 420 and/or the adaptation step size adaptor 440. In other embodiments, two or more of the delay element 425, the filter adaptation block 427, and the adaptation step size block 440 can be integrated with one another.

In yet another embodiment, the adaptation step sizes of the adaptive filter 420 can be varied over time. For example, the adaptation step size can have an initial value $\mu_0$ at time $t_0$. At fixed time intervals, the adaptation step size can be decreased exponentially. For example, adaptation step size μ can be decreased from $10^{-3}$ to $10^{-10}$ at fixed time intervals, such that $\mu_0 = 10^{-3}$ for time-index $n = n_0$ to $n_1$, $\mu_2 = 10^{-4}$ from time-index $n_1$ to $n_2$, and so on. The values of adaptation step sizes varying over time n, and the time-index boundaries $n_0, n_1, \ldots n_n$ can be stored in the look-up table 442.

In some embodiments, the adaptation step sizes vary over time, while having different values for different taps as described above in connection with Equations 7-1 to 7-N. In one embodiment, only μ(0) is varied over time and other adaptation steps sizes, μ(1), μ(2), μ(3), . . . are advantageously computed based on μ(0) as shown in Equations 7-1 to 7-N above. In an alternative embodiment, one or more of coefficients are independently computed.

Thus, values for coefficients for the taps can be efficiently computed to compensate for drift over time. For example, after a time interval from $n_0$, the Equations 8-1 to 8-N can be changed as in Equations 9-1 to 9-N. This configuration speeds up the convergence by orders of magnitude.

Tap 0: $w_{n+1}[0] = w_n[0] - \mu_1(0) y[n] y[n-0]$, Equation 9-1
in which $\mu_1(0) = \mu_0(0) \times 10^{-1}$ Tap 1: $w_{n+1}[1] = w_n(1) - \mu_1(1) y[n] y[n-1]$ Equation 9-2
$= w_n(1) - 2^{-1} \mu_1(0) y[n] y[n-1]$ Tap 2: $w_{n+1}[2] = w_n[2] - \mu_1(2) y[n] y[n-2]$ Equation 9-3
$= w_n[2] - 2^{-2} \mu_1(0) y[n] y[n-1]$ $$\vdots \qquad \vdots$$

Tap n: $w_{n+1}[3] = w_n[N-1] - \mu_1(N-1) y[n] y[n-N+1]$ Equation 9-N
$= w_n[N-1] - 2^{-(N-2)} \mu_1(0) y[n] y[n-N+1]$ Referring to FIG. 4B, a method of varying adaptation step sizes for an adaptive filter according to one embodiment will be described below. In the illustrated embodiment, only μ(0)

is varied over time and other adaptation steps sizes, $\mu(1)$, $\mu(2)$, $\mu(3)$, . . . are advantageously computed based on $\mu(0)$ as shown in Equations 7-1 to 7-N above. The method can be performed by, for example, the adaptation step size adaptor 440 of FIG. 4A.

In the illustrated embodiment, at step 481, an initial adaptation step size $\mu(0)$ is provided for the first tap. At step 482, adaptation step sizes $\mu(1)$, $\mu(2)$, $\mu(3)$, . . . for other taps are generated based on $\mu(0)$. All the adaptation step sizes $\mu(0)$, $\mu(1)$, $\mu(2)$, $\mu(3)$, . . . are provided to the adaptive filter for filtering at step 483. At step 484, a clock is checked to determine whether a preselected time interval has passed. If so, the adaptation step size $\mu(0)$ for the first tap is updated at step 485. In the illustrated embodiment, the value of $\mu(0)$ is reduced, and the reduced value is provided for computing the other adaptation step sizes $\mu(1)$, $\mu(2)$, $\mu(3)$, . . . at step 482. This process is repeated until the filter is adapted for I/Q imbalance compensation.

Normalized Adaptation Step Size for Adaptive Filter

Figure 5:
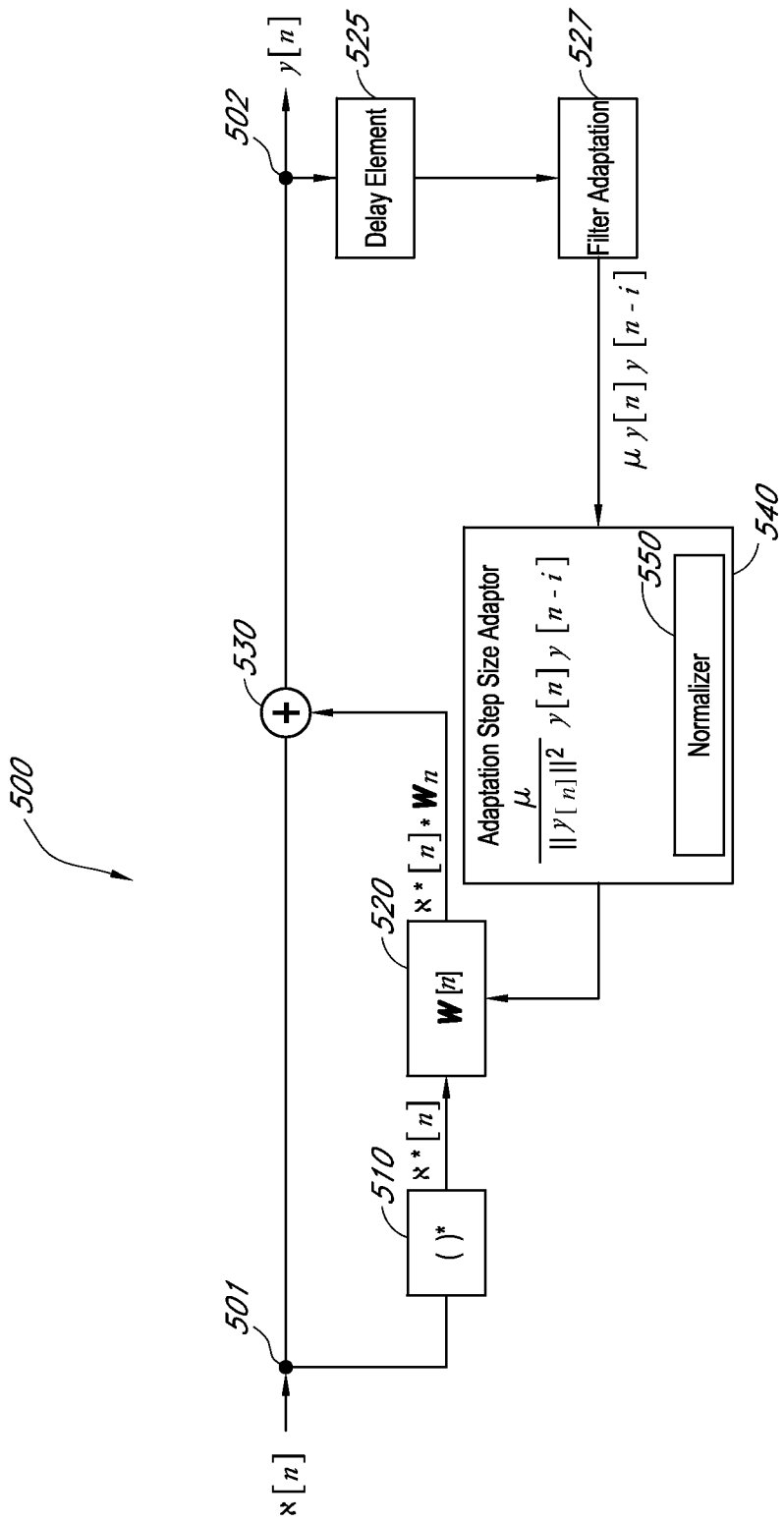
FIG. 5 is a schematic block diagram illustrating an I/Q imbalance compensation module according to yet another embodiment.

Referring to FIG. 5, an I/Q imbalance compensation module with an adaptive filter having a normalized variable adaptation step size according to yet another embodiment will be described below. The illustrated I/Q imbalance compensation module 500 includes a first node 501, a second node 502, a complex conjugation block 510, an adaptive filter 520, a delay element 525, a filter adaptation block 527, an adder 530, an adaptation step size adaptor 540, and an optional controller (not shown). In one embodiment, each of the conjugation block 510, the adaptive filter 520, the delay element 525, the filter adaptation block 527, the adder 530, and the adaptation step size adaptor 540 can be implemented in firmware or hardware. The conjugation block 510, the adaptive filter 520, and the adder 530 can operate real time. The delay element 525, the filter adaptation block 527, and the adaptation step size adaptor 540 can operate non-real time.

A complex digital signal x[n] is provided to the first node 501 from the I and Q paths of a receiver, such as the I and Q paths of FIG. 1. The digital signal x[n] is provided to the adder 530 and the conjugation block 510. Other details of the first node 501, the second node 502, the conjugation block 510, the delay element 525, the filter adaptation block 527, and the adder 530 can be as described above in connection with the first node 201, the second node 202, the conjugation block 210, the delay element 225, the filter adaptation block 227, and the adder 230, respectively, of FIG. 2A.

The adaptive filter 520 can be a finite impulse response (FIR) filter with coefficients $w_n$ that serves to perform a convolution operation (*) on the conjugate signal x*[n] to generate a compensation signal expressed as x*[n]*$w_n$. In one embodiment, the configuration of the adaptive filter 520 can be the same as that of the adaptive filter 220 of FIG. 2A except that the adaptation step size $\lambda$ is replaced with an adaptation step size normalized by received signal strength. Such a normalized adaptation step size can be denoted as $\lambda/\|y_n\|^2$. In another embodiment, the configuration of the adaptive filter 520 can be the same as that of the adaptive filter 320 of FIG. 3 except that the adaptation step size $\lambda$ is replaced with the normalized step size $\lambda/\|y_n\|^2$. Thus, the adaptive signal $w_n$ can be iteratively updated as expressed in Equations 10-a or 10-b below.

$$w_{n+1}=w_n-\lambda y_n y[n]/\|y_n\|^2 \qquad \text{Equation 10-a}$$

$$w_{n+1}(i)=w_n(i)-\lambda y[n]y[n-i]/\|y_n\|^2, \text{ where } i=0, 1, \ldots N-1. \qquad \text{Equation 10-b}$$

In the Equations 10-a and 10-b, $\|y_n\|^2$ represents the squared-norm of the data vector $y_n$, and can be expressed in Equation 11 below.

$$\|y_n\|^2=(y[n]\cdot y^*[n]+y[n-1]\cdot y^*[n-1]+ \ldots +y[n-N+1]\cdot y^*[n-N+1])/N \qquad \text{Equation 11}$$

In Equation 11, N is the length of the filter, i.e., the number of taps. The adaptation step size is scaled by the norm or magnitude of the data vector y(n).

The adaptation step size adaptor 540 serves to provide the noun of the output data y(n) for the adaptive filter 530. The adaptation step size adaptor 540 can include a normalizer 550 to compute the norm. In the illustrated embodiment, the adaptor 540 is depicted as being separate from the adaptive filter 520. A skilled artisan will, however, appreciate that the adaptation step size adaptor 540 can be integrated with the adaptive filter 520.

The embodiment described in connection with FIG. 5 can be combined with one or more of the embodiments described above in connection with FIGS. 3, 4A, and 4B, which can further speed up the convergence of the adaptive filter 520. For example, the embodiment of FIG. 5 can be combined with the model reduction technique of FIG. 3. The embodiment of FIG. 5 can be combined with different adaptation step sizes for different taps and/or adaptation step size varying over time described above in connection with FIGS. 4A and 4B. The embodiment of FIG. 5 can be combined with both (1) the model reduction technique of FIG. 3, and (2) different adaptation step sizes for different taps and/or adaptation step size varying over time described above in connection with FIGS. 4A and 4B.

EXAMPLES

Figure 6:
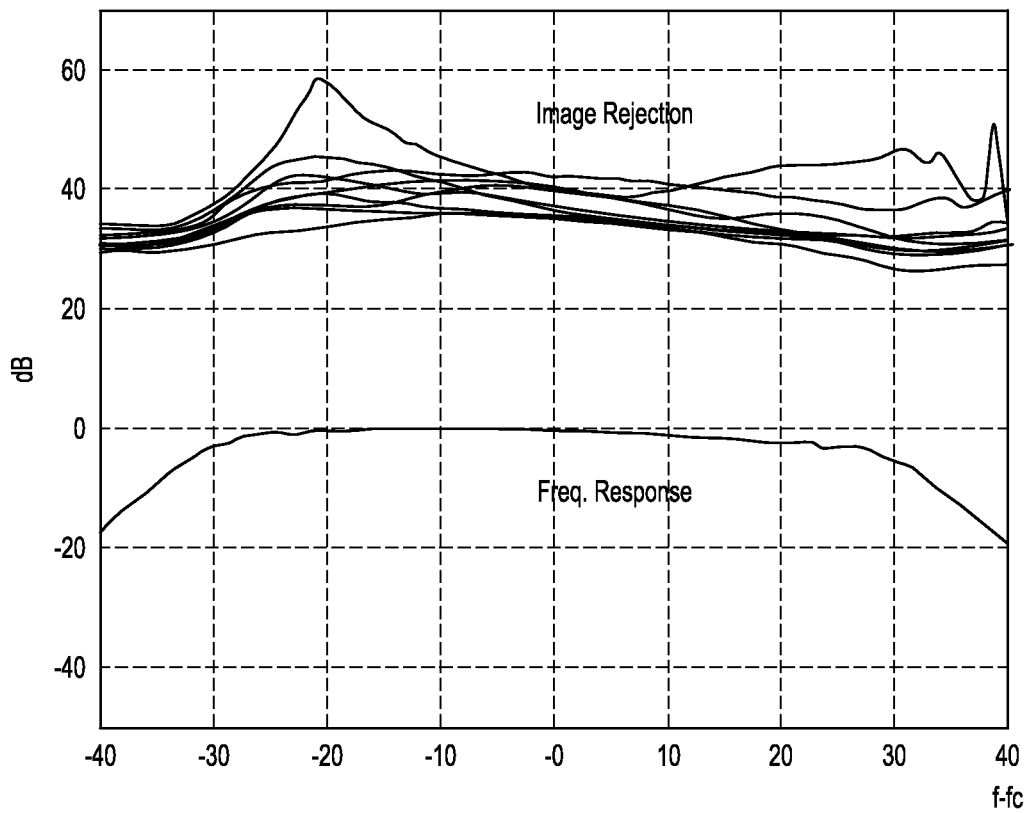
FIG. 6 is a graph showing image rejection ratio performance of an RF receiver without I/Q imbalance compensation.

In Example 1, a center frequency (a measure of a central frequency between the upper and lower cutoff frequencies) $f_c$ of 875 MHz, a 100 MHz ADC, and a 7th-order Butterworth low pass filter were used for an RF receiver with no compensation. The measured results from actual hardware measurement are shown in FIG. 6, which shows a frequency response for one particular silicon sample of the receiver design, and the image rejection ratios for different sample silicon chips with the said receiver design.

Figure 7:
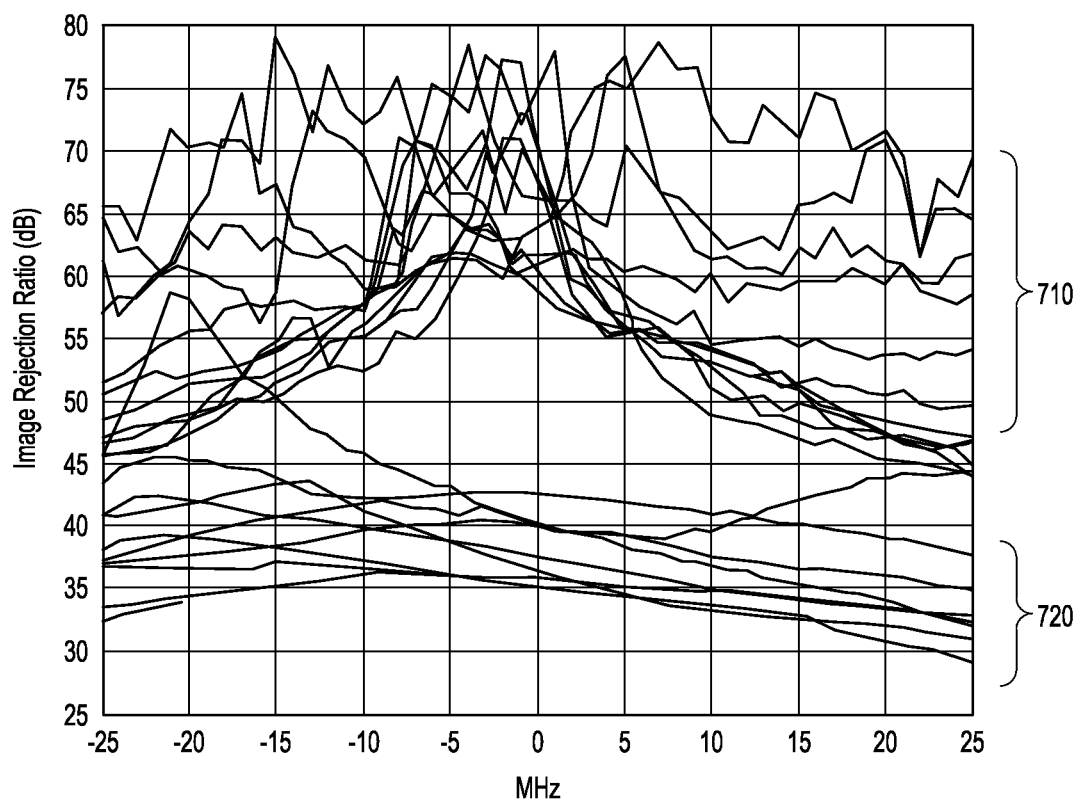
FIG. 7 is a graph showing image rejection ratio performances of a conventional I/Q imbalance compensation module and an I/Q imbalance compensation module according to one embodiment.

In Example 2, a center frequency $f_c$ of 875 MHz, a 100 MHz ADC, and a $7^{th}$-order Butterworth low pass filter were used with a combination of the embodiments of FIGS. 3-5. In Example 2, an adaptive filter by model reduction was provided with normalized variable adaptation step sizes per tap and over time. The result is shown in FIG. 7 in solid lines, which shows image rejection ratios 710 and frequency responses 720. The Example 2 shows greater image rejection ratios (at least 45 dB) over a wider frequency band than those of Anttila et al. Further, the Example 2 shows convergence time of about 100 msec.

Further, the adaptive filter of the Example 2 exhibited that the convergence time was reduced from 2-3 seconds (Anttila et al.) to about 100 msec. Further, the complexity of the filter was reduced by approximately ½ since only w(0) is a complex number.

Alternative Embodiments

Figure 8:
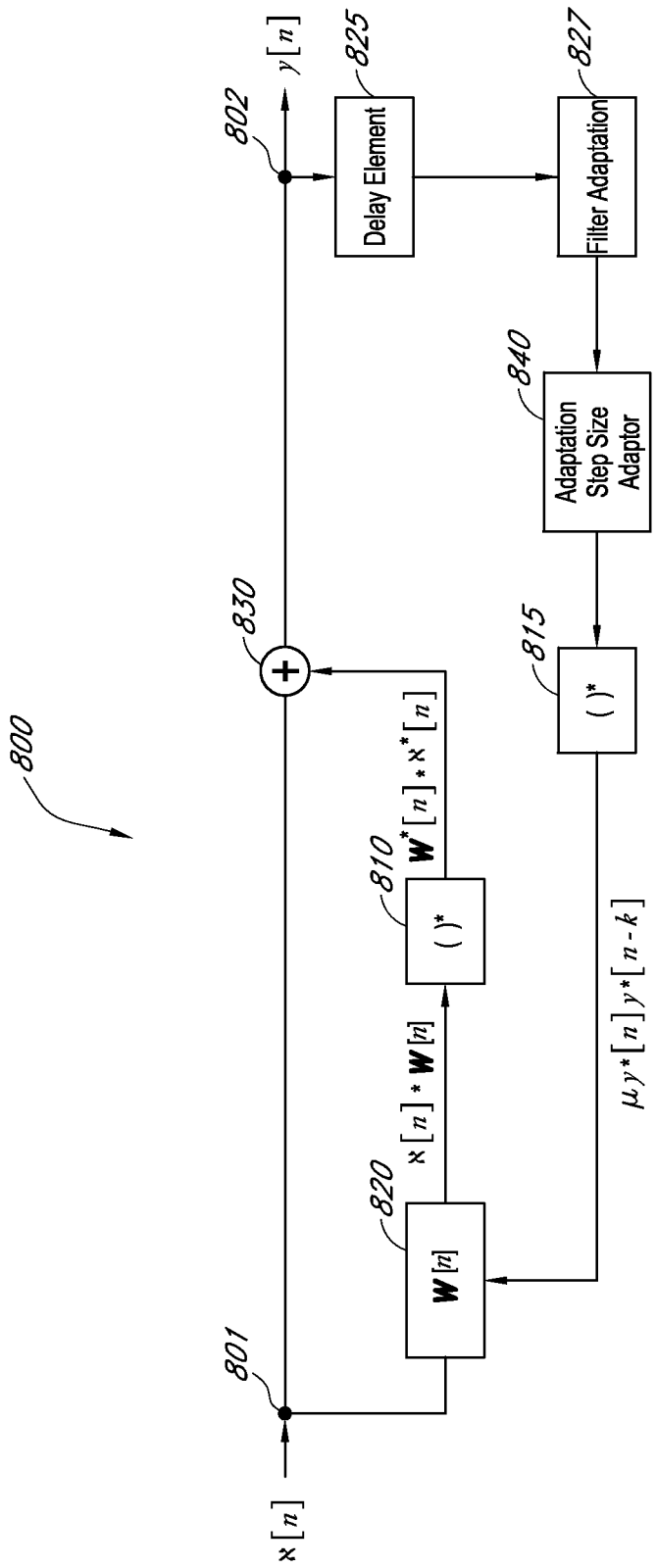
FIG. 8 is a schematic block diagram illustrating an I/Q imbalance compensation module according to another embodiment.

Referring to FIG. 8, an I/Q imbalance compensation module according to another embodiment will be described below. The illustrated I/Q imbalance compensation module 800 includes a first node 801, a second node 802, a first complex conjugation block 810, a second complex conjugation block 815, an adaptive filter 820, a delay element 825, a filter adaptation block 827, an adder 830, and an adaptation step size adaptor 840. FIG. 8 shows only one example of alternative configurations that are mathematically equivalent to the I/Q imbalance compensation modules of FIGS. 3, 4A and 5. A skilled artisan will appreciate that there are many other alternative configurations mathematically equivalent to the I/Q imbalance compensation modules of FIGS. 3, 4A and 5.

A complex digital signal x[n] is provided to the first node 801 from the I and Q paths of a receiver, such as the I and Q paths of FIG. 1. The digital signal x[n] is provided to the adder 830 and the adaptive filter 820. The adaptive filter 820 receives a feedback signal generated from an output signal y[n] through the delay element 825, the filter adaptation block 827, the adaptation step size adaptor 840, and the second complex conjugation block 815 to update values of filter coefficients w[n].

The adaptive filter 820 can perform a convolution operation on the complex digital signal x[n] and the filter coefficients w[n] to generate an intermediate signal. The intermediate signal from the adaptive filter 820 is provided to the first complex conjugation block 810. A complex conjugate of the intermediate signal is generated by the first complex conjugation block 810, and is provided to the adder 830 to reduce or cancel I/Q imbalance in the complex digital signal x[n]. The illustrated I/Q imbalance compensation module 800 can be mathematically equivalent to one of the I/Q imbalance compensation modules 300, 400, 500 of FIG. 3, 4A, or 5.

In the illustrated embodiment, (1) the model reduction described in connection with FIG. 3 and/or (2) one or more of the variable adaptation step size schemes described in connection with 4A-5 can be used for effective I/Q imbalance compensation. In an embodiment in which only the model reduction is used, the adaptation step size adaptor is omitted.

Figure 9:
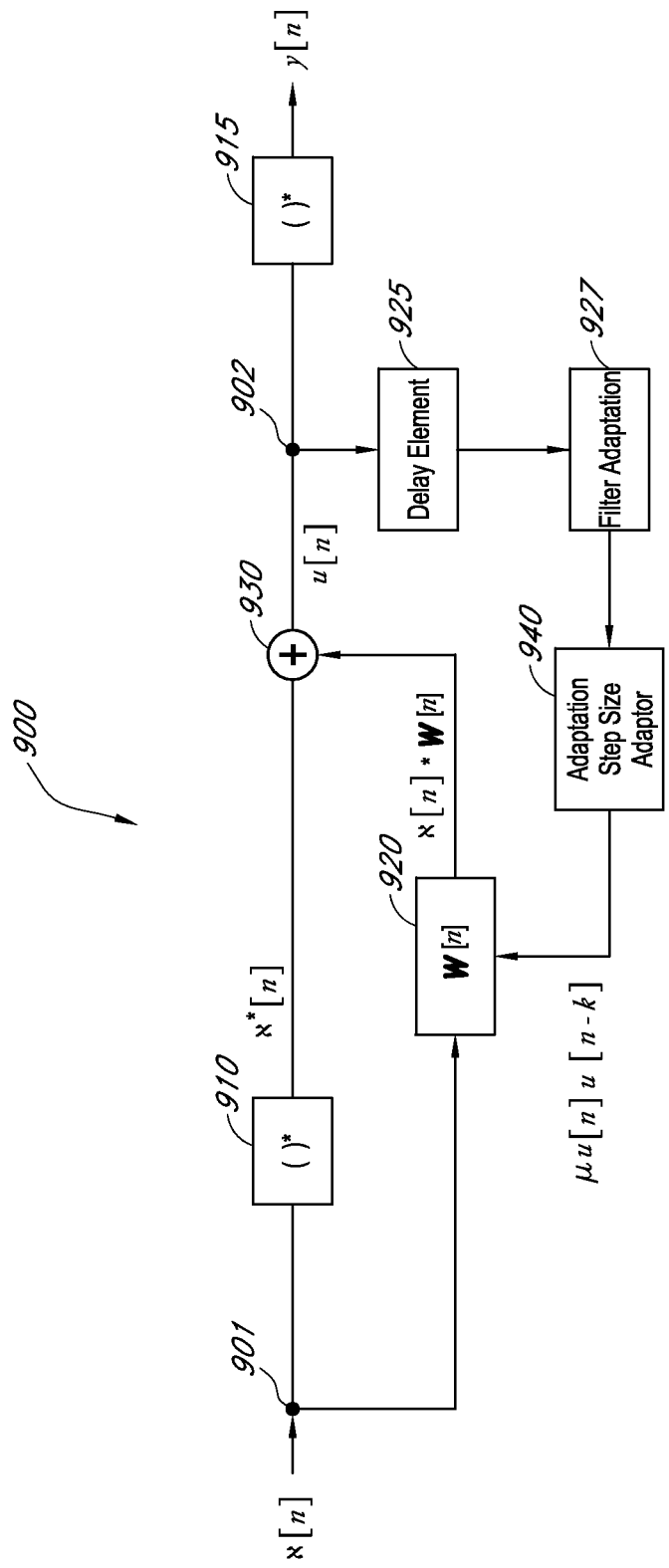
FIG. 9 is a schematic block diagram illustrating an I/Q imbalance compensation module according to yet another embodiment.

Referring to FIG. 9, an I/Q imbalance compensation module according to yet another embodiment will be described below. The illustrated I/Q imbalance compensation module 900 includes a first node 901, a second node 902, a first complex conjugation block 910, a second complex conjugation block 915, an adaptive filter 920, a delay element 925, a filter adaptation block 927, an adder 930, and an adaptation step size adaptor 940.

A complex digital signal x[n] is provided to the first node 901 from the I and Q paths of a receiver, such as the I and Q paths of FIG. 1. The digital signal x[n] is provided to the first complex conjugation block 910, which generates a complex conjugate of the digital signal x[n]. The complex conjugate of the digital signal x[n] is provided to the adder 930.

The complex digital signal x[n] is also provided to the adaptive filter 920. The adaptive filter 920 receives a feedback signal generated from an intermediate signal u[n] outputted from the adder 930 through the delay element 925, the filter adaptation block 927, and the adaptation step size adaptor 940 to update values of filter coefficients w[n].

The adaptive filter 920 can perform a convolution operation on the complex digital signal x[n] and the filter coefficients w[n] to generate a filter output signal. The filter output signal from the adaptive filter 920 is provided to the adder 930 to reduce or cancel I/Q imbalance in the complex conjugate of the complex digital signal x[n]. The intermediate signal u[n] outputted from the adder 930 is provided to the second complex conjugation block 915 to generate an output signal y[n]. The illustrated I/Q imbalance compensation module 900 can be mathematically equivalent to one of the I/Q imbalance compensation modules 300, 400, 500, 900 of FIG. 3, 4A, 5, or 9.

In the illustrated embodiment, (1) the model reduction described in connection with FIG. 3 and/or (2) one or more of the variable adaptation step size schemes described in connection with 4A-5 can be used for effective I/Q imbalance compensation. In an embodiment in which only the model reduction is used, the adaptation step size adaptor is omitted.

Figure 10:
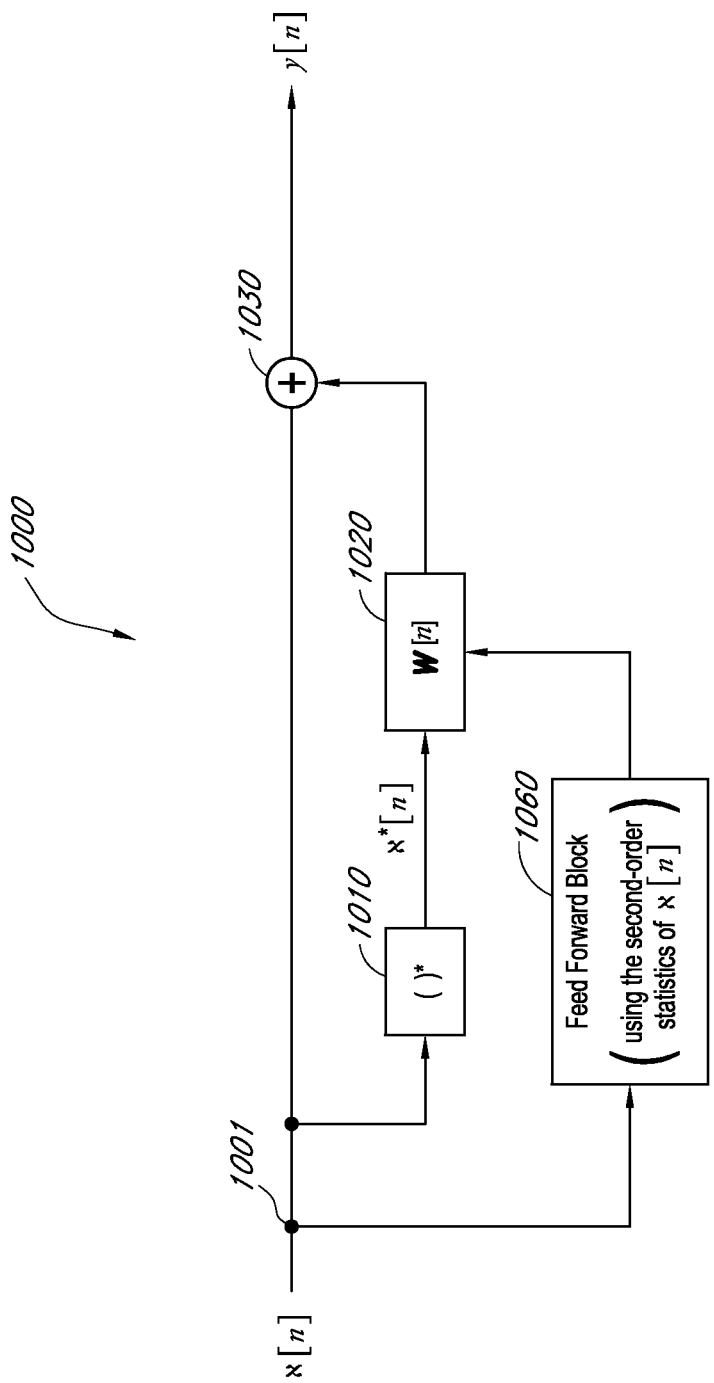
FIG. 10 is a schematic block diagram illustrating an I/Q imbalance compensation module according to yet another embodiment.

Referring to FIG. 10, an I/Q imbalance compensation module according to yet another embodiment will be described below. The illustrated I/Q imbalance compensation module 1000 includes a first node 1001, a complex conjugation block 1010, an adaptive filter 1020, an adder 1030, and a feed forward block 1060.

A complex digital signal x[n] is provided to the first node 1001 from the I and Q paths of a receiver, such as the I and Q paths of FIG. 1. The digital signal x[n] is provided to the first complex conjugation block 1010, which generates a complex conjugate of the digital signal x[n], which is then provided to the adaptive filter 1020. The digital signal x[n] is also provided to the adder 1030.

The adaptive filter 1020 receives a feed forward signal generated from the feed forward block 1060 to update values of filter coefficients w[n]. The feed forward block 1060 can generate the feed forward signal, using only the second-order statistics of the digital signal x[n]. Details of using only the second-order statistics of the digital signal x[n] are described at pages 2105 and 2106 of Anttila et al., "Circularity-Based I/Q Imbalance Compensation in Wideband Direct-Conversion Receivers," IEEE Transactions on Vehicular Technology, Vol. 57, No. 4, pp. 2099-2113 (July 2008).

The feed forward block 1060 serves to null complementary autocorrelation of an output signal for the span of the compensation filter (N samples), $E[y(n)y(n)]=0$, which is equivalent to Equation 12.

$$c_x + \Gamma_x w + \overline{\Gamma}_x w + WC^*_x w = 0 \quad \text{Equation 12}$$

In Equation 12, $c_x \triangleq E[x(n)x(n)] = [c_x(0), c_x(1), \ldots c_x(N-1)]^T$ with $x(t) \triangleq [x(n)x(n-\overline{1}), \ldots, x(n-N+1)]^T$. $\Gamma_x, \overline{\Gamma}_x, C_x$, and $W$ are defined below in Equation 13-a to 13-d.

$$\Gamma_x \triangleq \begin{bmatrix} \gamma_x(0) & \gamma_x(1) & \ldots & \gamma_x(N-1) \\ \gamma_x^*(1) & \gamma_x(0) & \ldots & \gamma_x(N-2) \\ \vdots & \vdots & \ddots & \vdots \\ \gamma_x^*(N-1) & \gamma_x^*(N-2) & \ldots & \gamma_x(0) \end{bmatrix} \quad \text{Equation 13-a}$$

$$\overline{\Gamma}_x \triangleq \begin{bmatrix} \gamma_x(0) & \gamma_x(1) & \ldots & \gamma_x(N-1) \\ \gamma_x(1) & \gamma_x(2) & \ldots & \gamma_x(N) \\ \vdots & \vdots & \ddots & \vdots \\ \gamma_x(N-1) & \gamma_x^*(N) & \ldots & \gamma_x(2N-2) \end{bmatrix} \quad \text{Equation 13-b}$$

$$C_x \triangleq \begin{bmatrix} c_x(0) & c_x(1) & c_x(2) & \ldots & c_x(N-1) \\ c_x(1) & c_x(0) & c_x(1) & \ldots & c_x(N-2) \\ c_x(2) & c_x(1) & c_x(0) & \ldots & c_x(N-3) \\ \vdots & \vdots & \vdots & & \vdots \\ c_x(2N-2) & c_x(2N-3) & c_x(2N-4) & \ldots & c_x(N-1) \end{bmatrix} \quad \text{Equation 13-c}$$

$$W \triangleq \begin{bmatrix} w^T & 0 & \ldots & 0 \\ 0 & w^T & \ldots & 0 \\ \vdots & & \ddots & \vdots \\ 0 & 0 & \ldots & w^T \end{bmatrix} \quad \text{Equation 13-d}$$

N represents the number of taps or filter coefficients of the adaptive filter 1020 (vector w). The matrix $C_x$ has dimensions $(2N-1) \times N$. Matrix W, which is constructed from the adaptive filter coefficients, has a size $N \times (2N-1)$. A solution to Equation 12 can be computed iteratively. In one embodiment, the last term $WC_x^* w$ on the left-hand side of Equation 12 can be ignored, and the filter coefficients w of the adaptive filter 1020 can be obtained from Equation 14 below.

$$w = -(\Gamma_x + \overline{\Gamma}_x)^{-1} c_x \qquad \text{Equation 14}$$

The adaptive filter 1020 can perform a convolution operation on the complex conjugate x*[n] of the digital signal x[n] and the filter coefficients w[n] to generate a filter output signal. The filter output signal from the adaptive filter 1020 is provided to the adder 1030 to reduce or cancel I/Q imbalance in the complex digital signal x[n], thereby generating an output signal y[n]. In the illustrated embodiment, the model reduction technique described in connection with FIG. 3 can be used for effective I/Q imbalance compensation. A skilled artisan will appreciate that there are other ways of solving, either exactly or approximately, Equation (12), and that the model reduction technique described above can also apply to the other ways.

Applications

The embodiments described above can be effectively used for wide-band RF receivers covering from DC to about −3 dB corners, operating at a frequency of, for example, about 50 MHz to about 100 MHz. The configurations and principles of the embodiments can also be adapted for any other electronic devices, such as transceivers or receivers (for example, direct conversion receivers, super-heterodyne receivers, and low intermediate frequency receivers), that can use I/Q imbalance compensation for a quadrature path.

The circuits employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include cable modems, wireless devices, and networking equipment. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a finite impulse response (FIR) filter configured to filter a version of a digital signal to generate a compensation signal, wherein the FIR filter has filter coefficients, wherein the digital signal comprises a digital representation of a demodulated in-phase and quadrature phase component of a radio frequency (RF) signal;
an adder configured to sum another version of the digital signal and a version of the compensation signal to generate a balanced digital signal that has an improved image rejection ratio versus the digital signal; and
an adaptation step size adaptor configured to provide two or more different adaptation step sizes for updating the filter coefficients, wherein a selected one of the two or more different adaptation step sizes is configured to be multiplied with two or more samples of the balanced digital signal to generate an adjustment for a filter coefficient of the FIR filter,
wherein one of the versions of the digital signal or the version of the compensation signal is a complex conjugate of the digital signal or a complex conjugate of the compensation signal, respectively, and the others are not the complex conjugates, wherein the FIR filter and the adder comprise electronic hardware.

2. The apparatus of claim 1, further comprising:
a delay element configured to delay the balanced digital signal; and
a filter adaptation block configured to generate a feedback signal using the delayed balanced digital signal, and to provide the feedback signal to the FIR filter through the adaptation step size adaptor for updating the filter coefficients.

3. The apparatus of claim 1, wherein the adaptation step size adaptor is further configured to vary adaptation step sizes for one or more of the filter coefficients over time.

4. The apparatus of claim 3, wherein the FIR filter has X real number filter coefficients and Y imaginary number coefficients, wherein Y is less than X.

5. The apparatus of claim 3, wherein the adaptation step size adaptor is further configured to divide adaptation step sizes for one or more of the filter coefficients by a squared norm of the balanced digital signal.

6. The apparatus of claim 5, wherein the FIR filter has X real number filter coefficients and Y imaginary number coefficients, wherein Y is less than X.

7. The apparatus of claim 6, wherein the FIR filter has only 1 imaginary number coefficient and the 1 imaginary number coefficient is present only for a first tap of the FIR filter.

8. The apparatus of claim 1, wherein the adaptation step size adaptor is further configured to divide adaptation step sizes for one or more of the filter coefficients by a squared norm of the balanced digital signal.

9. The apparatus of claim 8, wherein the FIR filter has X real number filter coefficients and Y imaginary number coefficients, wherein Y is less than X.

10. An apparatus comprising:
a finite impulse response (FIR) filter configured to filter a version of a digital signal to generate a compensation signal, wherein the FIR filter has filter coefficients, wherein the digital signal comprises a digital representation of a demodulated in-phase and quadrature phase component of a radio frequency (RF) signal;

an adder configured to sum another version of the digital signal and a version of the compensation signal to generate a balanced digital signal that has an improved image rejection ratio versus the digital signal; and an adaptation step size adaptor configured to vary adaptation step sizes over time for adaptive adjustment of one or more of the filter coefficients such that the one or more filter coefficients are updated based at least partly on a multiplication product of a selected one of a plurality of different step sizes and two or more samples of the balanced digital signal, wherein one of the versions of the digital signal or the version of the compensation signal is a complex conjugate of the digital signal or a complex conjugate of the compensation signal, respectively, and the others are not the complex conjugates, wherein the FIR filter and the adder comprise electronic hardware.

11. The apparatus of claim 10, further comprising:

a delay element configured to delay the balanced digital signal;

a filter adaptation block configured to generate a feedback signal using the delayed balanced digital signal, and to provide the feedback signal to the FIR filter through the adaptation step size adaptor for updating the filter coefficients.

12. The apparatus of claim 10, wherein the adaptation step size adaptor is further configured to divide adaptation step sizes for one or more of the filter coefficients by a squared norm of the balanced digital signal.

13. The apparatus of claim 12, wherein the FIR filter has X real number filter coefficients and Y imaginary number coefficients, wherein Y is less than X.

14. An apparatus comprising:

a finite impulse response (FIR) filter configured to filter a version of a digital signal to generate a compensation signal, wherein the FIR filter has filter coefficients, wherein the digital signal comprises a digital representation of a demodulated in-phase and quadrature phase component of a radio frequency (RF) signal;

an adder configured to sum another version of the digital signal and a version of the compensation signal to generate a balanced digital signal that has an improved image rejection ratio versus the digital signal; and an adaptation step size adaptor configured to provide adaptation step sizes for updating the filter coefficients, wherein the adaptation step size adaptor is configured to divide adaptation step sizes for one or more of the filter coefficients by a squared norm of the balanced digital signal, wherein one of the versions of the digital signal or the version of the compensation signal is a complex conjugate of the digital signal or a complex conjugate of the compensation signal, respectively, and the others are not the complex conjugates, wherein the FIR filter and the adder comprise electronic hardware.

15. A method of improving an image rejection ratio of a digital signal having demodulated in-phase and quadrature-phase components of a radio frequency signal, the method comprising:

filtering a version of the digital signal with a finite impulse response (FIR) filter having filter coefficients to generate a compensation signal, wherein filtering is implemented by hardware or by instructions implemented by a processor;

generating a complex conjugate of the digital signal or the compensation signal;

summing another version of the digital signal and a version of the compensation signal to generate a balanced digital signal that has an improved image rejection ratio versus the digital signal, wherein one of the versions of the digital signal and the version of the compensation signal corresponds to a complex conjugate of the digital signal or the compensation signal, respectively, and the others are not the complex conjugates;

generating a feedback signal by multiplying a correlation of the balanced digital signal with two or more different adaptation step sizes to generate adjustments for the filter coefficients; and determining the filter coefficients, using the feedback signal.

16. The method of claim 15, wherein generating the feedback signal further comprises varying at least one of the adaptation step sizes over time.

17. The method of claim 15, wherein generating the feedback signal further comprises dividing at least one of the adaptation step sizes by a squared norm of the balanced digital signal.

18. A method of improving an image rejection ratio of a digital signal having demodulated in-phase and quadrature-phase components of a radio frequency signal, the method comprising:

filtering a version of the digital signal with a finite impulse response (FIR) filter having filter coefficients to generate a compensation signal, wherein filtering is implemented by hardware or by instructions implemented by a processor;

generating a complex conjugate of the digital signal or the compensation signal;

summing another version of the digital signal and a version of the compensation signal to a generate a balanced digital signal that has an improved image rejection ratio versus the digital signal, wherein one of the versions of the digital signal and the version of the compensation signal corresponds to a complex conjugate of the digital signal or the compensation signal, respectively, and the others are not the complex conjugates;

generating a feedback signal by multiplying a correlation of the balanced digital signal with one or more adaptation step sizes to generate adjustments for the filter coefficients, wherein at least one of the adaptation step sizes is varied over time; and determining the filter coefficients, using the feedback signal.

19. The method of claim 18, wherein generating the feedback signal further comprises dividing at least one of the adaptation step sizes by a squared norm of the balanced digital signal.

20. A method of improving an image rejection ratio of a digital signal having demodulated in-phase and quadrature-phase components of a radio frequency signal, the method comprising:

filtering a version of the digital signal with a finite impulse response (FIR) filter having filter coefficients to generate a compensation signal, wherein filtering is implemented by hardware or by instructions implemented by a processor;

generating a complex conjugate of the digital signal or the compensation signal;

summing another version of the digital signal and a version of the compensation signal to generate a balanced digital signal that has an improved image rejection ratio versus the digital signal, wherein one of the versions of the digital signal and the version of the compensation signal corresponds to a complex conjugate of the digital signal or the compensation signal, respectively, and the others are not the complex conjugates;

generating a feedback signal by multiplying a correlation of the balanced digital signal with one or more adaptation step sizes for the filter coefficients, wherein the one or more of the adaptation step sizes is divided by a squared norm of the balanced digital signal; and determining the filter coefficients, using the feedback signal.

* * * * *